United States Patent [19]

Nakanishi et al.

[11] 4,310,492

[45] Jan. 12, 1982

[54] APPARATUS FOR MAKING A SINGLE CRYSTAL

[75] Inventors: Masae Nakanishi; Kiyoshi Nakamura; Syozo Kawasaki, all of Yokohama, Japan

[73] Assignee: Tokyo Shibaura Denki Kabushiki Kaisha, Kawasaki, Japan

[21] Appl. No.: 151,877

[22] Filed: May 21, 1980

[30] Foreign Application Priority Data

Nov. 14, 1979 [JP] Japan .................................. 54-146496

[51] Int. Cl.³ ...................... C30B 15/24; C30B 15/34; C30B 35/00
[52] U.S. Cl. ................................... 422/246; 156/608; 156/617 SP; 422/249
[58] Field of Search ................ 422/246, 249; 156/607, 156/608, 617 SP, DIG. 99, DIG. 88; 106/73.2, 73.4, 73.5

[56] References Cited

U.S. PATENT DOCUMENTS

| | | | |
|---|---|---|---|
| 3,969,125 | 7/1976 | Komeya et al. | 106/73.5 |
| 4,196,171 | 4/1980 | Watanabe et al. | 422/246 |
| 4,230,494 | 10/1980 | Nakamura et al. | 106/73.4 |

FOREIGN PATENT DOCUMENTS

| | | | |
|---|---|---|---|
| 51-2712 | 1/1976 | Japan | 156/DIG. 99 |
| 5418816 | 7/1977 | Japan . | |
| 5439570 | 9/1977 | Japan . | |

*Primary Examiner*—Bradley Garris
*Attorney, Agent, or Firm*—Oblon, Fisher, Spivak, McClelland & Maier

[57] ABSTRACT

An apparatus for making a single crystal which includes a sealed vessel, a crucible received in the sealed vessel to hold a molten liquid and a floating member having an opening for defining the cross sectional outline of a single crystal while being grown and floating on the molten liquid. The floating member is made from a sintered body consisting essentially of at least one of the oxides of yttrium and the lanthanum series elements, aluminum oxide, aluminum nitride and silicon nitride each in a prescribed amount.

5 Claims, 2 Drawing Figures

APPARATUS FOR MAKING A SINGLE CRYSTAL

BACKGROUND OF THE INVENTION

1. Field of the Invention

The present invention relates to an apparatus for making a single crystal and, more particularly, is directed to an apparatus which includes a sealed vessel, a crucible received in the sealed vessel to hold a molten liquid and a floating member having an opening defining the cross sectional outline of a single crystal while being grown and floating on the molten liquid.

2. Description of the Prior Art

Japanese Patent Application Disclosure No. 54-39570 (laid open to the public inspection on Mar. 27, 1979 and corresponding U.S. patent application Ser. No. 930,696, now U.S. Pat. No. 4,196,171) discloses an apparatus for making a single crystal of III-V compound semiconductive material which includes a sealed vessel, a crucible received in the sealed vessel to hold a molten liquid of a III-V compound semiconductive material from which a single crystal is to be grown and a floating member floating on the molten liquid, the floating member having an opening defining the cross sectional outline of the single crystal during its growth and being formed of a sintered body consisting essentially of 0.5 and 10% by weight of at least one metal oxide member selected from the group consisting of an oxide of yttrium and lanthanum series elements, 0.5 to 10 by weight of aluminum oxide and the balance of silicon nitride.

Japanese Patent Application Disclosure No. 54-18816 (laid open to the public inspection on Feb. 13, 1979 and corresponding U.S. patent application Ser. No. 924,358, now U.S. Pat. No. 4,230,494) discloses material for the above mentioned floating member, which consists of a compound made of silicon nitride and metal oxide member selected from yttrium oxide, cerium oxide and aluminum oxide and silicon nitride.

However, it is not easy to produce the floating member made of the above mentioned materials because of the relatively long length of time necessary for sintering and adhering to the mold to occur.

SUMMARY OF THE INVENTION

Accordingly, it is an object of the present invention to overcome the drawbacks of the prior art and to provide an apparatus for making a single crystal having a floating member which can be easily produced and which is desirable in obtaining a single crystal havings its cross sectional outline subject to minimal distortion and displaying high crystallinity.

This and other objects have now herein been attained by providing an apparatus for making a single crystal which includes a sealed vessel, a crucible received in the sealed vessel to hold a molten liquid from which a single crystal is to be grown and a floating member floating on the molten liquid, the floating member having an opening defining the cross sectional outline of the single crystal during its growth and being formed of a sintered body consisting essentially of 0.5 to 5.0% by weight of at least one metal oxide member selected from the group consisting of oxides of yttrium and the lanthanum series elements; b 0.5 to 5.0% by weight of aluminum oxide; 0.1 to 2.0% by weight of aluminum nitride; and the balance of silicon nitride.

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts through the several views and wherein.

DETAILED DESCRIPTION OF THE PREFERRED EMBODIMENTS

Figure 1:
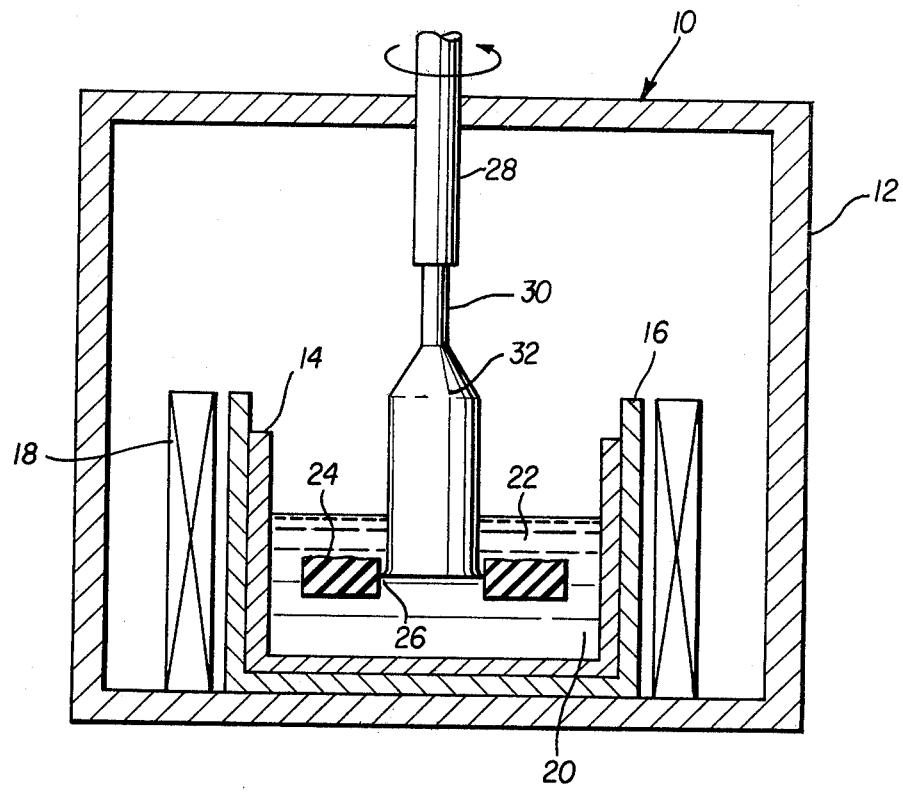
FIG. 1 is a schematic sectional view of an apparatus according to the present invention.

As seen from FIG. 1, an apparatus 10 according to the present invention includes a sealed pressure vessel 12 and a crucible 14 formed of inert material such as quartz and received in the sealed vessel 12. The crucible 14 is held in a receptacle 16 around which a heater 18 is disposed. The crucible 14 contains a molten liquid 20 and, optionally, an encapsulating molten liquid 22 overlying the molten liquid 20.

A floating member 24 provided with an opening 26 defining the cross outline of a single crystal during its growth is set in an interface between the molten liquid 20 and 22. The floating member 24 is formed of a sintered body consisting essentially of 0.5 to 5.0% oxide member selected from the group consisting of oxides of yttrium and the lanthanum series elements (i.e., elements having an atomic number of 57 to 71), 0.5 to 5.0% by weight of aluminum oxide, 0.1 to 2.0% by weight of aluminum nitride and silicon nitride as the remainder. The floating member 24 has a smaller density than the molten liquid 20 and a greater density than the encapsulating molten liquid 22.

In operating, the raw material of a single crystal and an overlying encapsulating material are placed in the crucible 14 and heated by heater 18 to be rendered molten and the floating member 24 is located in a prescribed position. Then, a speed crystal 30 fitted to a rotary jig 28 is brought into contact with molten liquid 20 through the molten liquid 22 of the encapsulating material in the opening 26 of the floating member 24 and the seed 30 is slowly pulled up by means of the rotary jig 28 by the customary process while rotating the jig 28 in the direction of the indicated arrow, thereby growing a single crystal 32. The interior of the sealed vessel 12 is kept at a sufficiently high level of pressure to prevent evaporation of the molten liquids 20, 22 (where a single crystal of, for example, gallium phosphide is grown, a pressure of 40 atm. or above is applied). The cross sectional outline of the single crystal 32 in the process of being grown is defined by the shape of the opening of the floating member 24. The floating member is shifted downward as the content of the molten liquid 20 decreases.

The apparatus of the present invention is preferably applied to make a single crystal of the III-V compound semiconductive material. The III-V compound semiconductive material includes a binary system such as gallium phosphide, indium phosphide and gallium arsenide and a ternary system such as gallium phosphide arsenide. A typical semiconductive material is gallium phosphide or gallium arsenide.

Preferred among the above-listed oxides of yttrium and the lanthanum series elements to form the floating member are yttrium oxide, lanthanum oxide and cerium oxide, and even more preferred is yttrium oxide. A mixture of two or more of the metal oxide members may also be used.

After the full growth of a single crystal, the molten liquids remaining in the crucible are solidified with floating member 24 immersed therein. Therefore, floating member 24 is readily subject to breakage due to mechanical shocks resulting from such solidification and fails to be repeatedly applied. Where repeatedly applied, it is difficult to prepare a high crystallinity single crystal which is subject to unusual distortion. However, a single crystal grown by the apparatus of the present invention using the above mentioned floating member 24 has its cross sectional outline subject to minimal distortion and displays high crystallinity. Accordingly, using the single crystal of the III-V compound semiconductive material in accordance with the present invention as a substrate of a light emitting diode results in high emissivity.

Floating member 24 of the apparatus of the present invention is made from a sintered body consisting essentially of a relatively small amount of oxides of yttrium and lanthanum series elements and a relatively small amount of aluminum oxide, aluminum nitride and silicon nitride. Therefore, floating member 24, which guarantees preparation of a single crystal having its cross sectional outline rendered subject to minimal distortion and displaying high crystallinity, can be produced in a short sintering time while scarcely adhering to the mold.

Where the content of a metal oxide member of aluminum oxide exceeds 5% by weight, a single crystal passing through the opening of floating member 24 serves to indicate a distorted cross sectional outline and decline in crystallinity. Where the content of the metal oxide member or aluminum oxide falls below 0.5% by weight, the density of the sintered body will decrease. Where the content of aluminum nitride exceeds 2% by weight, a single crystal will indicate a distorted cross sectional outline and decline in crystallinity. Where the content of aluminum nitride falls below 0.1% by weight, it will be difficult to easily obtain a single crystal having its cross sectional outline rendered subject to minimal distortion and displaying high crystallinity.

A floating member having the above-mentioned composition can be conveniently prepared by hot press-sintering. Where a mixture of powders of the raw materials of the above-defined composition is placed in a prescribed mold and sintered under a pressure of 150 to 500 kg/cm$^2$ at a temperature of 1600° to 1800° C., a desired floating member can be produced in a relatively short period of time. The hot press-sintering is generally carried out in a non-oxidizing atmosphere.

EXAMPLE

Figure 2:
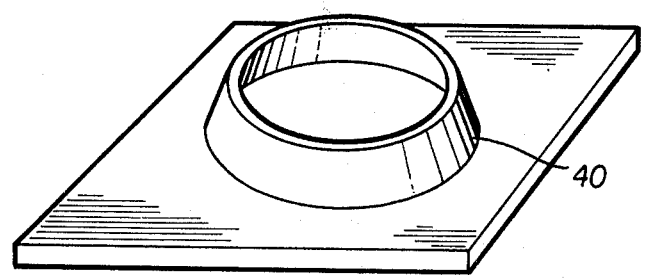
FIG. 2 is a prospective view of a floating member of an apparatus according to the present invention.

Floating members having the composition as shown in the following Table were prepared, the shape thereof being as illustrated in FIG. 2, by hot press-sintering under a pressure of 400 kg/cm$^2$ at a temperature of 1700° C. in an nitrogen atmosphere. A single crystal was grown by the apparatus arranged as shown in FIG. 1 with the above-mentioned floating members.

Throughout preparation of the examples, a single crystal was prepared from gallium phosphide. This main raw material was mixed with 1 to $10 \times 10^{17}$ cm$^{-3}$ of tellurium as an impurity. Boron trioxide was used as an encapsulating material. Single crystals of gallium phosphide 11 cm in length and 4.5 cm in diameter were grown by the customary process. With respect to the crystals, a determination was made of diameter change, concentration of dislocation pits (D pits) corresponding to dislocation lines defining the crystallinity of the crystal, concentration of saucer pits (S pits) not corresponding to the dislocation lines and the life time of minority carriers. The results are accordingly set forth in the Table.

Slices were cut out of the respective single crystal samples for use as a substrate. A layer of gallium phosphide was formed on the substrate with the same conductivity type as that of the substrate by the customary regrowth method accompanied with counter dope. Another layer of gallium phosphide having the opposite conductivity type was mounted by liquid phase growth on the first mentioned gallium phosphide layer. The resultant slices were cut into cubic chips measuring 0.5 mm on each side. The chips were embedded in epoxy resin to provide green light-emitting diode devices. The emission efficiency of these green light-emitting diode devices is also indicated in the Table. The ease in sintering the floating members is also indicated in the Table.

| No. of Example | Composition of floating member (% by weight) | | | | | Diameter change (mm) | Properties of a single crystal | | | Emission efficiency (%) | Ease of sintering the floating member | |
|---|---|---|---|---|---|---|---|---|---|---|---|---|
| | Si$_3$N$_4$ | Y$_2$O$_3$ | La$_2$O$_3$ | Al$_2$O$_3$ | AlN | | D pit concentration (cm$^{-2}$) | S pit concentration (cm$^{-2}$) | Minority carrier life time (nsec) | | Time to reach the density of 95% (min) | No. of adhering to the mold (%) |
| 1 | 93.5 | — | 0.5 | 5 | 1.0 | ±1 | ≲1 × 10$^5$ | ≲1 × 10$^3$ | 260 | 0.40 | 10 | 5 |
| 2 | 93.5 | 5 | — | 0.5 | 1.0 | ±1 | ≲1 × 10$^5$ | ≲1 × 10$^3$ | 280 | 0.43 | 110 | 6 |
| 3 | 91 | 2 | — | 5 | 2.0 | ±1 | ≲1 × 10$^5$ | ≲1 × 10$^3$ | 282 | 0.48 | 85 | 5 |
| 4 | 92.9 | 2 | — | 5 | 0.1 | ±1 | ≲1 × 10$^5$ | ≲5 × 10$^2$ | 303 | 0.48 | 100 | 8 |
| 5 | 89 | 5 | — | 5 | 1.0 | ±1 | ≲1 × 10$^5$ | ≲5 × 10$^2$ | 280 | 0.45 | 60 | 8 |
| 6 | 93.5 | 0.5 | — | 5 | 1.0 | ±1 | ≲1 × 10$^5$ | ≲1 × 10$^3$ | 265 | 0.41 | 100 | 4 |
| 7 (ref.) | 93 | 2 | — | 5 | — | ±1 | ≲1 × 10$^5$ | ≲5 × 10$^2$ | 310 | 0.48 | 120 | 13 |
| 8 (ref.) | 90 | 5 | — | 5 | — | ±1 | ≲1 × 10$^5$ | ≲5 × 10$^2$ | 295 | 0.45 | 100 | 18 |
| 9 (ref.) | 90 | 2 | — | 5 | 3.0 | ±2 | ≲3 × 10$^5$ | ≲1 × 10$^5$ | 249 | 0.48 | 65 | 5 |

Obviously, many modifications and variations of the present invention are possible in light of the above teachings. It is therefore understood that within the scope of the appended claims the invention may be practiced otherwise than as specifically described.

What is claimed as new and desired to be secured by Letters Patent of the United States is:

1. An apparatus for making a single crystal comprising:
   a sealed vessel;
   a crucible received in the sealed vessel to hold a molten liquid from which a single crystal is to be grown; and
   a floating member floating on said molten liquid, said floating member including an opening defining the cross sectional outline of said single crystal during growth of said single crystal being formed of said floating member comprising a sintered body consisting essentially of 0.5 to 5% by weight of at least one metal oxide member selected from the group consisting of oxide of yttrium and the lanthanum series elements; 0.5 to 5% by weight of aluminum oxide; 0.1 to 2.0% by weight of aluminum nitride and the balance of silicon nitride.

2. An apparatus according to claim 1, further comprising heating means positioned around said crucible for heating said molten liquid and said encapsulating layer.

3. An apparatus according to claim 2, further comprising means for contacting a seed crystal with said molten liquid through said encapsulating layer in said opening of said floating member and for growing said single crystal while being slowly pulled up from said encapsulating layer through said opening of said floating member.

4. An apparatus according to claims 1, 2 or 3 wherein said metal oxide member is selected from the group consisting of yttrium oxide, lanthanum oxide and cerium oxide.

5. An apparatus according to claims 1, 2 or 3 wherein said metal oxide member comprises yttrium oxide.

* * * * *